(12) United States Patent
Gorbold

(10) Patent No.: US 7,859,223 B2
(45) Date of Patent: Dec. 28, 2010

(54) BATTERY MONTORING APPARATUS AND DAISY CHAIN INTERFACE SUITABLE FOR USE IN A BATTERY MONITORING APPARATUS

(75) Inventor: Jeremy Richard Gorbold, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/011,615

(22) Filed: Jan. 28, 2008

(65) Prior Publication Data

US 2008/0180106 A1 Jul. 31, 2008

Related U.S. Application Data

(60) Provisional application No. 60/898,594, filed on Jan. 31, 2007.

(51) Int. Cl.
*H02J 7/00* (2006.01)
*H02J 7/16* (2006.01)
*G01N 27/416* (2006.01)

(52) U.S. Cl. .................. 320/119; 320/116; 320/120; 320/134; 320/118; 324/434; 324/429; 324/430

(58) Field of Classification Search ............. 324/434, 324/429, 430, 425; 320/134, 116, 117, 118, 320/119, 120, 121, 103, 104, 135, 136, 131, 320/138, 137
See application file for complete search history.

(56) References Cited

U.S. PATENT DOCUMENTS 5,099,205 A 3/1992 Lewyn (Continued)

FOREIGN PATENT DOCUMENTS

| WO | WO 96/21181 | 7/1996 |
| WO | WO 2008/010897 | 9/2008 |

OTHER PUBLICATIONS

PCT/US2008/001312, PCT search report and written opinion, Jun. 13, 2008.
Kudo, Akihiko et al, "Cell controller for lithium ion battery using ASIC", Shin-Kobe Electric Machinery Co., Ltd., 2006, pp. 16-20.

(Continued)

*Primary Examiner*—Edward Tso
*Assistant Examiner*—Alexis Boateng
(74) *Attorney, Agent, or Firm*—Knobbe, Martens, Olson & Bear LLP

(57) ABSTRACT

A battery monitor for monitoring the performance of at least one battery within an array of batteries, comprising: a data acquisition device for measuring at least one parameter of the at least one battery associated with the battery monitor, a first data interface operable to exchange data with a first device, and a second data interface operable to exchange data with a second device.

22 Claims, 4 Drawing Sheets

U.S. PATENT DOCUMENTS

| | | | |
|---|---|---|---|
| 5,359,296 | A | 10/1994 | Brooks et al. |
| 5,677,077 | A | 10/1997 | Faulk |
| 5,841,996 | A * | 11/1998 | Nolan et al. ................ 710/305 |
| 6,762,588 | B2 | 7/2004 | Miyazaki et al. |
| 6,891,352 | B2 * | 5/2005 | Miyazaki et al. ............ 320/118 |
| 2003/0044689 | A1 * | 3/2003 | Miyazaki et al. ............ 429/320 |
| 2004/0051534 | A1 | 3/2004 | Kobayashi et al. |
| 2004/0160229 | A1 | 8/2004 | Fujita et al. |
| 2005/0253559 | A1 * | 11/2005 | Felder ........................ 320/136 |
| 2007/0182375 | A1 * | 8/2007 | Lee ............................ 320/130 |

OTHER PUBLICATIONS

Analog Devices, "High voltage current shunt monitor (AD8212)", preliminary technical data, 2006, pp. 1-8.

PCT/US2008/002690, International search report and written opinion, Jun. 10, 2008.

* cited by examiner

< ADDRESS >< VOLTAGE1 >< Temperature >< VOLTAGE 2 >...

BATTERY MONTORING APPARATUS AND DAISY CHAIN INTERFACE SUITABLE FOR USE IN A BATTERY MONITORING APPARATUS

FIELD OF THE INVENTION

The present invention relates to a battery monitoring apparatus and to a daisy chain interface. Such a battery monitoring apparatus is suitable for monitoring groups of cells or individual cells within a battery stack.

BACKGROUND OF THE INVENTION

Rechargeable batteries can be used in many applications. One such application is the use of batteries in hybrid or fully electric vehicles. Within these vehicles a plurality of individual "cells" are arranged in series in order to build a battery stack having a desired output voltage. A large number of cells may be arranged in series such that, for example, the total potential difference developed across the battery stack is in the order of several hundred volts. Each cell typically only has a potential difference of a few, say 2 to 4, volts developed across it. Although the cells are similar, they are not identical, so repeated charging and discharging cycles may mean that the voltage developed across some cells within the stack are different to those developed across other cells within the stack. Ideally the voltage across each individual cell, or at least small groups of cells, would be monitored such that the cells could be temporarily removed from a charging process if their terminal voltage gets too high or alternatively if the cell temperature becomes unduly elevated. It is also possible to preferentially discharge cells to reduce their voltage. Whilst it is feasible to build a single battery monitoring apparatus that can operate across the entire voltage range, for example 0 to 400 volts, developed across a stack, this tends to be an expensive option.

SUMMARY OF THE INVENTION

According to the first aspect of the present invention there is provided a battery monitor for monitoring the performance of at least one battery within an array of batteries, comprising: a data acquisition device for measuring at least one parameter of the at least one battery associated with the battery monitor, a first data interface operable to exchange data with a first device, and a second data interface operable to exchange data with a second device.

Rather than use a single monitoring apparatus to monitor the entirety of the battery stack, the battery stack can be broken down into subunits and each of these subunits can then be monitored by an individual battery monitor. The potential difference spanning across each subunit is much reduced and as a result relatively inexpensive semiconductor fabrication processes can be used to fabricate integrated circuits capable of operating with the limited potential difference existing across the subunit within the battery stack.

Whilst dividing the monitoring task across a plurality of battery monitors reduces the voltage range that each monitor has to operate over, it is still necessary to communicate the output from the battery monitor to a data processing system. In order to reduce cost, for example by avoiding the need for potential dividers between the battery monitor and the individual cells it is desirable to allow the power rails of a given battery monitor to approach or equal the voltages occurring around the associated cells that are being monitored. Thus, for a first battery monitor its "negative" supply rail may be at 0 volts with respect to a ground voltage and its "positive" supply rail may be at, say, +25 volts. Consequently the second battery monitor supplies may float with respect to ground such that its "negative" supply rail is at +25 volts and its "positive" supply rail is a +50 volts. This pattern can continue and hence it can be seen that the outputs supply voltage and consequently the potentials at of some of the monitoring devices may occur as very high voltages indeed. The outputs can, of course, be coupled to other data processing systems by use of isolators, such as opto isolators, but these increase the overall system costs still further.

The inventor has realised that the voltage difference between neighbouring battery monitors is small and consequently it is possible to make direct electrical connection between a first battery monitor and its neighbouring battery monitor such that data may be passed between them. As used here, the term direct means without the use of DC blocking devices such as isolators or capacitors. This concept can be extended such that the battery monitors are arranged in series, often referred to a "daisy chain" such that the output from a monitor at a high voltage end of the battery stack can be progressively passed along the daisy chain until it reaches the final voltage monitor, which works at a relatively low voltage, which then interfaces to a further data processing system so as to pass information regarding the battery voltages to the data processing system.

According to a second aspect of the present invention there is provided a battery monitoring system comprising a plurality of battery monitors as claimed in claim 1, the monitors arranged in series such that the second data interface of an (j−1)th battery monitor is in communication with the first interface of a jth battery monitor, where j is an integer greater than one.

According to a third aspect of the present invention there is provided An interface for devices arranged, in use, to be connected in a daisy chain, the interface comprising an output path wherein a signal to be transmitted is used to modulate a current source, and an input path where a modulated current flowing in the input path is detected so as to recover data.

BRIEF DESCRIPTION OF THE FIGURES

Embodiments of the present invention will be described, by way of example only, with reference to the accompanying Figures, in which.

BRIEF DESCRIPTION OF PREFERRED EMBODIMENTS OF THE PRESENT INVENTION

Figure 1:
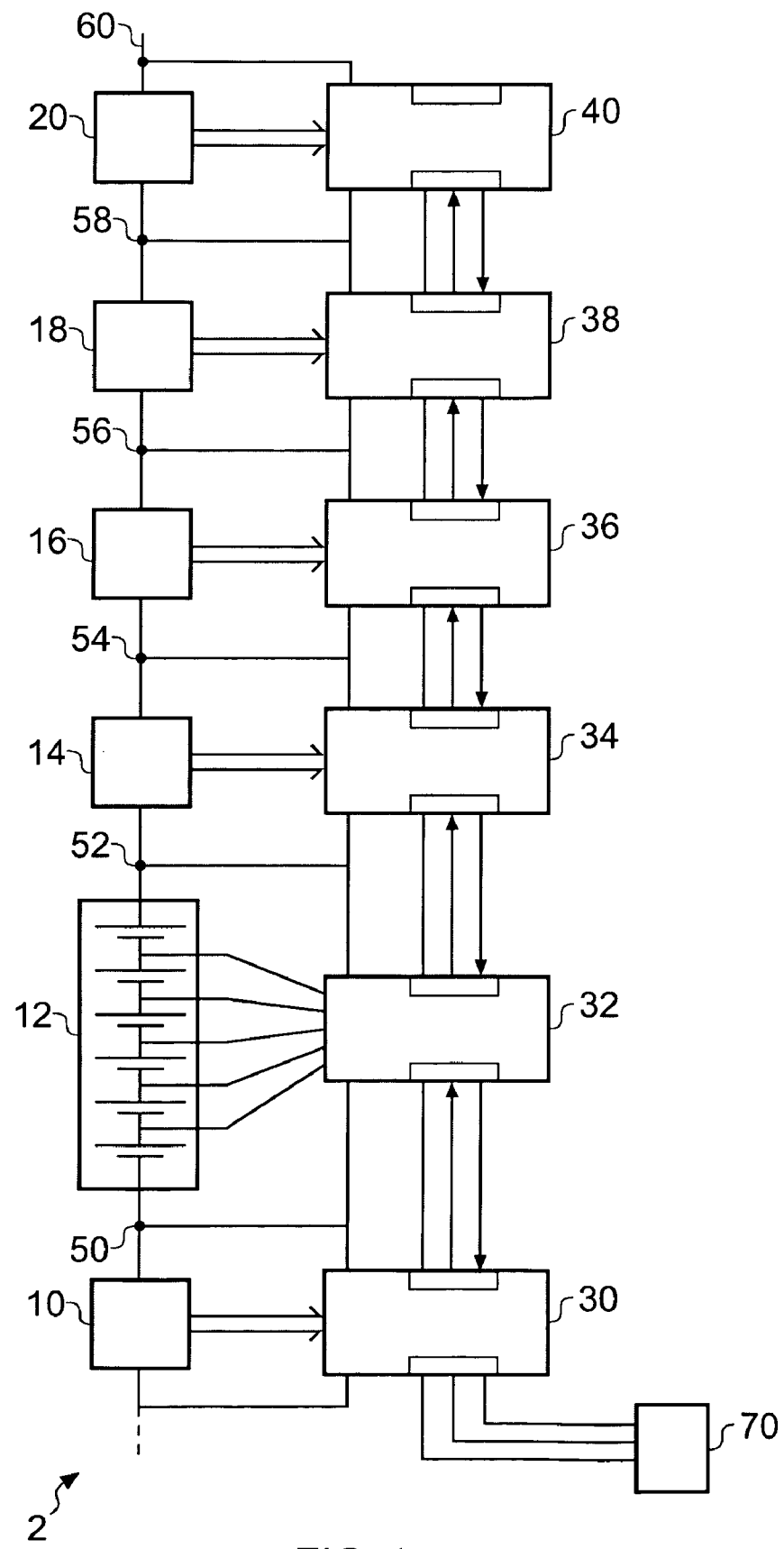
FIG. 1 schematically illustrates a plurality of battery modules within a battery stack, each module associated with a monitoring device.

FIG. 1 schematically shows a battery stack, generally designated 2, comprising first, second, third, fourth, fifth and sixth groups of cells 10, 12, 14, 16, 18 and 20 respectively. Each of the groups of cells is nominally identical, and for clarity, only the individual cells within the second group 12 are individually drawn. In this example each group of cells comprises six individual cells. Each group of cells is associated with a respective battery monitoring device, 30, 32, 34, 36, 38 and 40. Suppose, for example, that each group of cells develops around 25 volts across it when fully charged and that the cathode of the first group 10 is connected to a local ground. We can then see that the voltage occurring at a first node 50 between the first group of cells 10 and the second group of cells 12 is approximately 25 volts compared to the ground. Similarly the voltage occurring at a second node 52 between the second group of cells 12 and the third group of cells 14 is approximately 50 volts. The voltage occurring at a third node 54 is 75 volts, the voltage occurring at a fourth node 56 is 100 volts, the voltage occurring at node 58 is 125 volts and the voltage occurring at node 60 is 150 volts.

Each battery monitor can derive power for its own operation from the battery module which it is monitoring. Thus, for example, battery monitor 34 receives its local negative voltage by connection to node 52 and its local positive voltage by connection to node 54. This defines a voltage difference of up to 25 volts across the monitor 34. Typically it is desired to monitor the voltage across each individual cell in the battery stack rather than the total voltage across each one of the groups. Consequently, as shown in detail for the second battery monitor 32 a plurality of connections are made to nodes intermediate each one of the cells associated with the monitor 32 such that the potential difference across each individual cell can be measured, for example, by an analog to digital converter provided within the battery monitor 32. The result for each cell may be sent as a digital word to a system controller 70 such that the system controller 70 has knowledge of the voltage occurring across each individual cell and can control switches (not shown) to selectively remove one or more cells from the current path through the battery stack during a charging phase.

In this example, only one of the battery monitors, namely the first one 30, is in communication with the system controller 70. It should be noted that the communication path between the first battery monitor 30 and a controller 70 may itself include an additional isolating component, such as an opto isolator, so as to ensure that the system controller is protected from voltages occurring within the battery stack and within the battery voltage monitors.

Figures 2, 3:
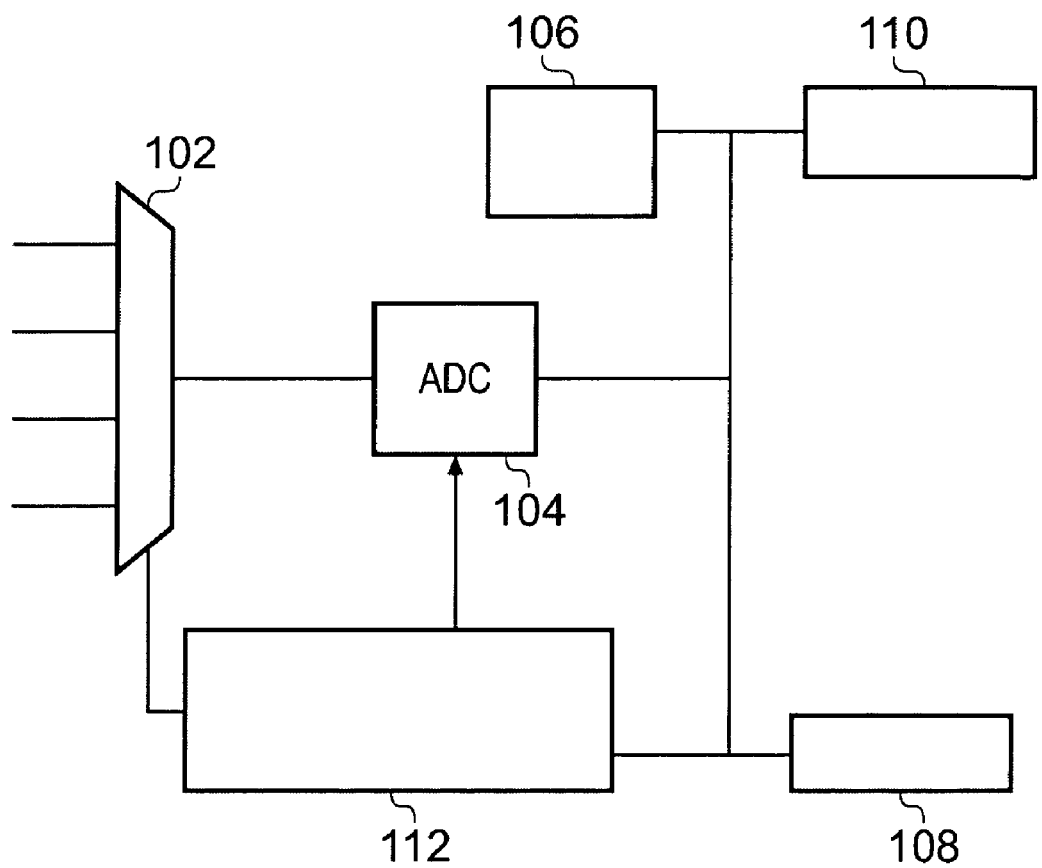
FIG. 2 is a schematic diagram of a battery monitoring device constituting an embodiment of the present invention.
FIG. 3 shows an example of a data word produced by the battery monitoring device of FIG. 2.

As shown in FIG. 2, each battery voltage monitor 30, 32, 34, 36 and so on includes a multiplexer 102, and analog to digital converter 104, a memory or similar temporary storage 106, a first data interface 108, a second data interface 110 and a controller 112 which coordinates the operation of the various parts of the battery monitor. The operation of the multiplexer, analog to digital converter, controller and memory are within the knowledge of the person skilled in the art and need not be described in detail here.

As can be seen from FIG. 1, the battery monitors are arranged in a daisy chain. Thus each monitor has at least a first neighbouring device connected to it and most have a second neighbouring device connected to them. Thus for the third battery monitor 34, its first neighbouring device is the second battery monitor 32 and its second neighbouring device is the fourth battery monitor 36.

The fact that each one of the battery monitors has different supply voltages makes data exchange between the battery monitors more difficult than if they were all at a common voltage. One simplistic approach would merely be to voltage drive the outputs of each monitor and to accept the fact that the voltage received at the input of adjacent voltage monitor would drive the transistors outside of the supply rails of that voltage monitor and would switch on internal parasitic diodes. Provided that precautions were taken to prevent excess current flow then such an arrangement would work, although it would be wasteful of power, dissipating excess heat, and the speed of operation would be limited by the need to discharge parasitic capacitors which had been charged to voltages significantly above that strictly necessary in order to convey the digital signal.

The inventor realised that these problems can be overcome by modulating a current exchange between adjacent battery monitors. Thus the voltage on the data transfer connection between adjacent devices is largely irrelevant. Suppose that in response to a control word from the system controller 70, each one of the battery monitors measures the voltage across each cell that it is monitoring, and also the temperature of individual cells or the group of cells. This data can be packaged in the word which might include an address field 130 indicating the battery monitor which made the measurement, then the voltage field for the first cell, and a temperature field for the first cell, this might then be followed by a voltage field, voltage 2, for the second cell, optionally a temperature for the second cell, a voltage for the third cell and so on. The precise format of the digital word is not important to this invention. Once the binary word has been derived, it is then necessary to transmit it from one voltage monitor to the next such that the word can be propagated down the chain of voltage monitors to the system controller 70. It should be noted that provided each monitor includes a first in first out buffer of sufficient length to buffer data that a monitor receives whilst sending its own data then all monitors can be instructed to read data from the batteries and to send it simultaneously as the daisy chain connection naturally causes the data to become serialised.

Figure 4:
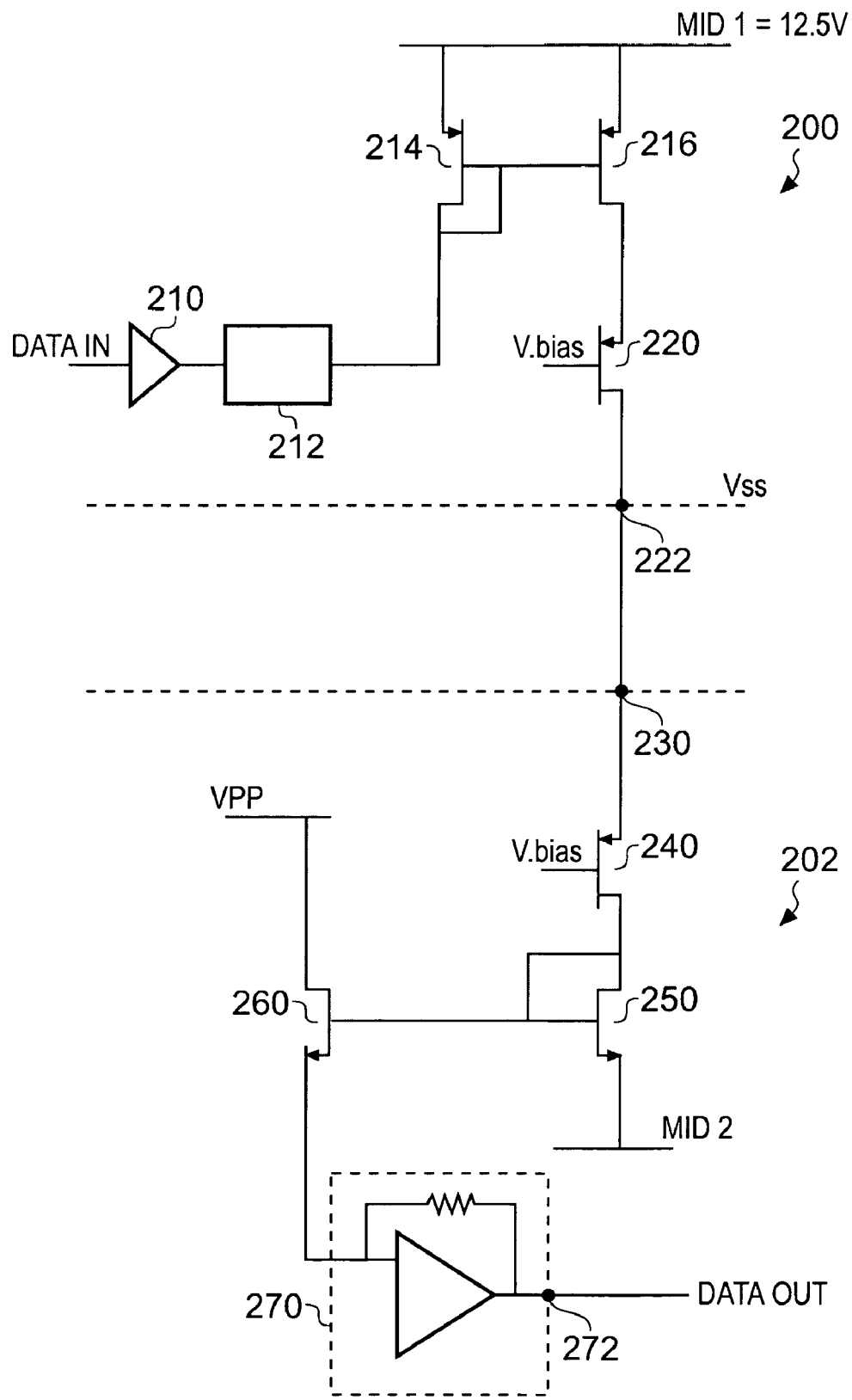
FIG. 4 shows an embodiment of interface components of neighbouring battery monitoring devices for exchanging data in a first direction (down the chain of devices shown in FIG. 1)

A suitable circuit for transmitting data down the chain of voltage monitors is shown in FIG. 4. The arrangement shown in FIG. 4 can be divided into a first portion, generally designated 200 which belongs to a first one of the voltage monitors and a second region generally designated 202 which belongs to a second one of the voltage monitors. Thus, region 200 could for example belong to a first data interface of the second battery monitor 32 whereas region 202 could belong to the second interface of the first battery voltage monitor 30. In this scenario data is transmitted downwardly, that is from device 32 to device 30. Within the first interface 200 of the data monitor 32 a buffer 210 is provided to act as an internal interface between the logic components (for example controller 112 of FIG. 2), which would generally be expected to run on a 3.3 or 5 volt range and the remaining analog components which might have to work with the entire voltage supply across the voltage monitor 32. For the device 32 we define the voltage node 50 to be VSS which equals its local 0 volts. We can then for convenience define a mid voltage rail, designated mid 1 which is held at halfway between the voltages at node 50 and node 52, and therefore in this example approximately 12.5 volts above the voltage at node 50. Of course, when referenced to the system ground mid 1 is actually at 62.5 volts.

An output of the buffer 210 is provided to an input of a voltage to current converter 212 which may be formed using any suitable circuitry but might even be something as simple as a resistor. This then defines the current that is drawn through the left hand most transistor 214 of a current mirror formed by the transistors 214 and 216. By virtue of the current mirroring action, the current flowing through transistor 216 matches that flowing through the transistor 214. A further transistor 220 is placed in series between a drain of the transistor 216 and an output node 222 of the interface 200. The transistor 220 acts as a cascode transistor as is known to the person skilled in the art. The output node 222 of the first interface is connected to an input node 230 of the second interface 202. The input node 230 is connected by a further cascode transistor 240 to transistor 250 which forms part of a current mirror in association with transistor 260. The source of the transistor 250 is connected to a local "mid2" voltage rail which is held halfway between the voltages occurring either side of the associated group of cells in the battery stack, which in this example would give a mid voltage of approximately 12.5 volts referenced to system ground. The current mirror action between transistors 250 and 260 ensures that the current flowing through transistor 260 mirrors that flowing through 250 and this is then sent to a current to voltage converter 270, which may be formed by an operational amplifier in order to give a voltage output. It can be seen that a voltage input to the buffer 210 is translated into the current domain, and is then passed by way of transistors 214, 216, 220, 240, 250 and 260 to the current voltage converter 270 such that the original data can be recovered at an output 272 of the current to voltage converter 270. Thus data can be passed down the chain of battery monitors with each battery monitor being in direct galvanic connection to an adjacent one.

The internal voltages MID1 and MID2 do not have to be at the mid-supply value for the voltage across any particular device. Indeed MID1 for the circuit shown in FIG. 4 could be Vpp for that device whereas MID2 could be at Vss for that device.

Figure 5:
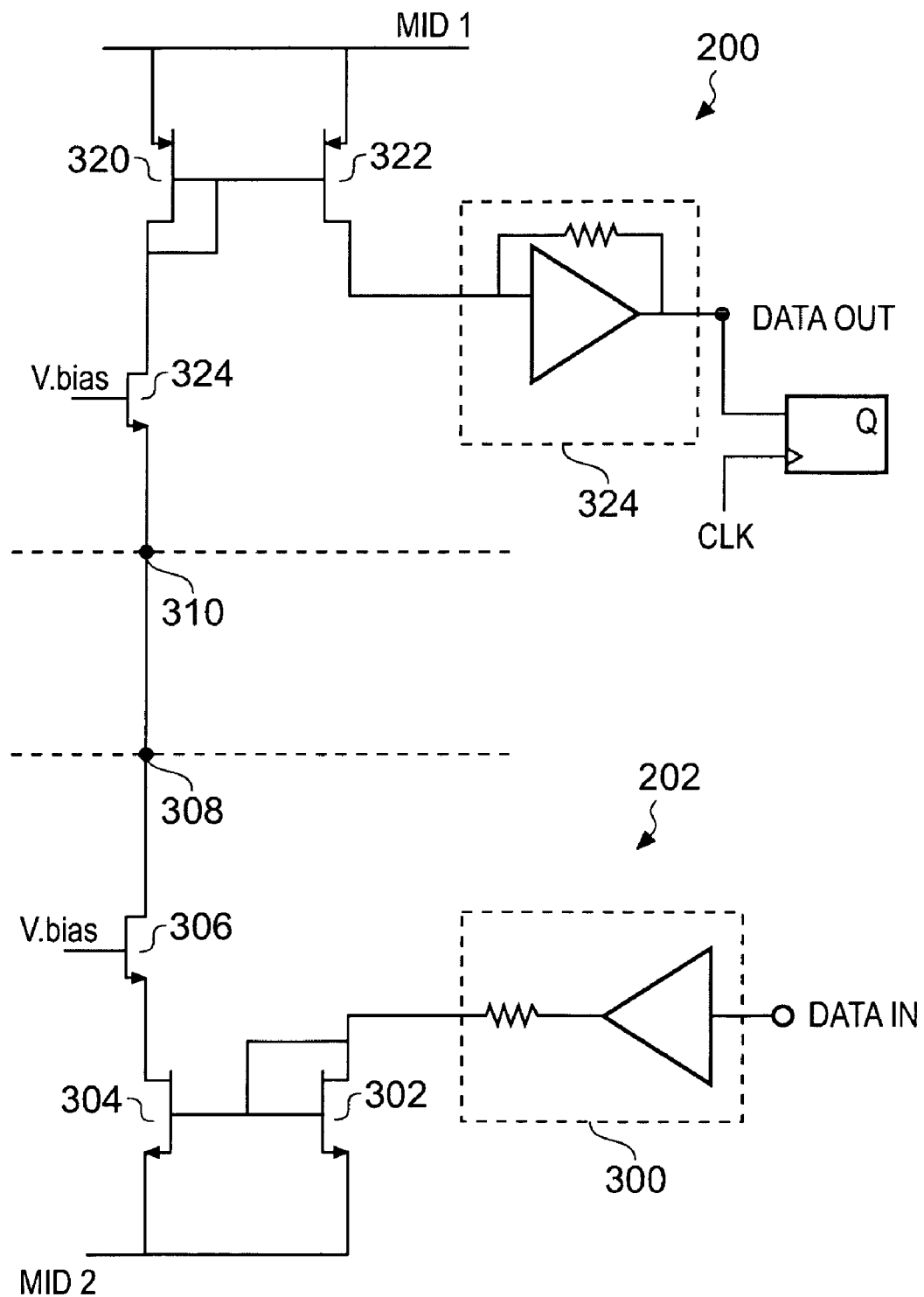
FIG. 5 schematically illustrates part of the interface components for transferring data from one battery monitoring device to a neighbouring device in a second direction (up the chain of devices shown in FIG. 1).

Similarly it is desirable to be able to send instructions from the system controller 70 to a selected one of the battery monitors within the chain. Thus, referring to FIG. 1, if the system controller 70 wishes to send an instruction to the fourth monitor 36, then it has to pass this via battery monitors 30, 32 and 34. This requires a circuit suitable for passing data up the chain, and such an arrangement is shown in FIG. 5 and, not unexpectedly, closely mirrors that shown in FIG. 4. Thus in order to pass data from, for example, the second interface 202 of device 30 to the first interface 200 of the second battery monitoring device 32 data is provided to a voltage to current converter 300, which may for example be in the form of a buffer followed by a resistor. Optionally a current mirror may be included in order to define the relevant voltages within the voltage to current converter. The output of the voltage to current converter is provided to drain of a transistor 302 which forms a current mirror with a second transistor 304. The drain of the transistor 304 is connected to an output node 308 via a cascode transistor 306. The output node 308 is connected to an input node 310 of the first interface 200 within the second battery monitor 32. The input node is connected to a first transistor 320 within a current mirror pair formed by transistors 320 and 322. Optionally a cascode transistor 324 can be inserted in the current path between the input node 310 and the transistor 320. The current mirror action ensures that the current flowing through the transistor 322 is identical to (or at least proportional to) the current flowing through transistor 320, and consequently transistor 304. The current flowing through transistor 322 is provided to a current to voltage converter 324 in order to recover a facsimile of the signal supplied to the voltage to current converter 300.

The data coding scheme used to transmit data between the devices could use a coding scheme such as non return to zero (NRZ) scheme or Manchester coding scheme which enables the data clock to be extracted from the data itself. However, other embodiments of the invention may include a clock line such that a clock pulse can be passed up the chain of battery voltage monitors and the clock pulse can be used to control the clocking of data into digital systems within each battery monitor. Given that the direction of clock pulse travel is unidirectional, that is a clock is always being received from the system controller 70 and being passed up the chain of battery voltage monitors then a circuit similar to that shown in FIG. 5 can be used to pass the clock. From one device to its neighbour up the chain of devices.

It is thus possible to provide a cascade of battery voltage monitors which work at radically different voltages but wherein each battery voltage monitor can be directly electrically connected to its nearest neighbour such that data could be passed up or down the chain of battery voltage monitors. Furthermore, given that each battery voltage monitor only spans a relatively small voltage range then it can be fabricated using relatively low voltage devices or a low voltage fabrication process. The interface described herein is not restricted to use with battery monitors and is suitable for passing data between devices whether they be fixed in voltage with respect to one another or may float with respect to one another.

The invention claimed is:

1. A battery monitor for monitoring the performance of at least one battery within an array of batteries, comprising:
   at least one data acquisition device for measuring at least one parameter of the at least one battery associated with the battery monitor;
   a first bi-directional data interface operable to bi-directionally exchange data with a first device; and
   a second bi-directional data interface operable to bi-directionally exchange data with a second device,
   wherein the first data interface comprises a transmit output for sending data to the first device, and
   wherein the first data interface modulates a current to be exchanged between the battery monitor and the first device so as to transmit data to the first device, and
   wherein the first data interface further comprises a cascode transistor such that the modulated current is passed to the transmit output through the cascode transistor.

2. A battery monitor as claimed in claim 1, in which the battery monitor has first and second power connections to at least one battery that it is monitoring, such that the supply voltages of the battery monitor float with respect to a ground voltage.

3. A battery monitor as claimed in claim 2, in which the supply voltages of a battery monitor may differ from those of neighbouring devices.

4. A battery monitor as claimed in claim 1, in which the second data interface has a clock output for outputting a clock signal.

5. A battery monitor as claimed in claim 1, further including a memory for buffering data such that data received at the second data interface can be stored prior to retransmission via the first interface.

6. A battery monitor as claimed in claim 1, further including a memory for buffering data such that data received at the first data interface can be stored prior to retransmission via the second interface.

7. A battery monitor as claimed in claim 1, in which the battery monitor measures at least one of a voltage occurring across a plurality of battery cells, a voltage occurring across each battery cell within a plurality of battery cells and temperature of at least one battery cell.

8. A battery monitoring system as claimed in claim 1, wherein each battery monitor is individually addressable.

9. An interface for devices arranged, in use, to be connected in a daisy chain, the interface comprising:

an output path wherein a voltage signal representing data is converted into a modulated current to be transmitted to a device in the daisy chain, and wherein the output path comprises an output node and a cascode transistor configured to pass the modulated current therethrough to the output node, and an input path wherein a modulated current flowing into the input path from a device in the daisy chain is detected so as to recover data.

10. A battery monitor as claimed in claim 1, in which the first interface further has a clock input for receiving a clock signal.

11. A battery monitor as claimed in claim 1, in which the second interface modulates a current to transmit data to the second device and the current passes through a cascode transistor and the second interface is responsive to changes in current exchanged with the second device to receive data.

12. An interface as claimed in claim 9, further including a clock path, wherein a clock signal is passed as a modulated current.

13. A battery monitor as claims in claims 1, wherein the first data interface comprises:
   a voltage-to-current converter configured to convert a voltage signal into a first current signal; and
   a current mirror circuit configured to receive the first current signal and to output a second current signal to the first device, wherein the current mirror circuit is provided with a non-fixed voltage from the at least one battery.

14. A battery monitor as claims in claims 1, wherein the second data interface comprises:
   a current mirror circuit configured to receive a first current signal from the second device, and to output a second current signal, wherein the current mirror circuit is provided with a non-fixed voltage from the at least one battery; and
   a current-to-voltage converter configured to convert the second current signal into a voltage signal.

15. A battery monitoring system comprising:
   two or more battery monitors connected in series, the two or more battery monitors being together configured to monitor a plurality of groups of battery cells connected in series, each of the monitors being configured to monitor one of the groups of battery cells,
   wherein at least one of the monitors comprises a first data interface and a second data interface,
   wherein the first data interface comprises:
      a voltage-to-current converter configured to convert a first voltage signal into a first current signal; and
      a first current mirror circuit configured to receive the first current signal and to output a second current signal to outside the at least one monitor, wherein the first current mirror circuit is provided with a first non-fixed voltage from the one of the groups of battery cells, and
   wherein the second data interface comprises:
      a second current mirror circuit configured to receive a third current signal from outside the at least one monitor, and to output a fourth current signal, wherein the second current mirror circuit is provided with a second non-fixed voltage from the one of the groups of battery cells; and
      a current-to-voltage converter configured to convert the fourth current signal into a second voltage signal.

16. The system of claim 15, wherein the first non-fixed voltage is the maximum voltage from the one of the groups of battery cells, and wherein the second non-fixed voltage is approximately a middle voltage between the maximum and minimum voltages from the one of the groups of battery cells.

17. The system of claim 15, wherein the first non-fixed voltage is the maximum voltage from the one of the groups of battery cells, and wherein the second non-fixed voltage is the minimum voltage from the one of the groups of battery cells.

18. The system of claim 15, wherein the first non-fixed voltage is approximately a middle voltage between the maximum and minimum voltages from the one of the groups of battery cells, and wherein the second non-fixed voltage is substantially the same as the first non-fixed voltage.

19. The system of claim 15, wherein the first non-fixed voltage is approximately a middle voltage between the maximum and minimum voltages from the one of the groups of battery cells, and wherein the second non-fixed voltage is the minimum voltage from the one of the groups of battery cells.

20. A battery monitor as claimed in claim 1, wherein the second data interface comprises a receive input and another cascode transistor such that a modulated current from the second device is passed through the receive input to the other cascode transistor, and
   wherein the second data interface demodulates the modulated current that has passed through the other cascode transistor to recover data.

21. A battery monitoring system comprising:
   a plurality of battery monitors connected in series to form a daisy chain, the battery monitors being together configured to monitor a plurality of groups of battery cells connected in series, each of the monitors being configured to monitor one of the groups of battery cells,
   wherein the plurality of monitors comprises a first monitor and a second monitor,
   wherein the first monitor comprises:
      a voltage-to-current converter configured to convert a first voltage signal representing digital data into a first current signal; and
      a first current mirror circuit configured to receive the first current signal and to output a second current signal, wherein the first current mirror circuit is provided with a first non-fixed supply voltage from one of the groups of battery cells, and
   wherein the second monitor comprises:
      a second current mirror circuit configured to receive the second current signal from the first monitor, and to output a third current signal, wherein the second current mirror circuit is provided with a second non-fixed supply voltage from one of the groups of battery cells; and
      a current-to-voltage converter configured to convert the third current signal into a second voltage signal representing the digital data,
      wherein the voltage-to-current converter, the first current mirror circuit, the second current mirror circuit, and the current-to-voltage converter form at least part of a digital data path between the first and second monitors.

22. The system of claim 21, wherein the first monitor further comprises a first cascode transistor controlled by a bias voltage, the first cascode transistor is configured to pass the second current signal to the second monitor,
   wherein the second monitor further comprises a second cascode transistor controlled by a bias voltage, the second cascode transistor is configured to pass the second current signal to the second current mirror circuit, and
   wherein the first and second cascode transistors form part of the digital data path.

\* \* \* \* \*

UNITED STATES PATENT AND TRADEMARK OFFICE
CERTIFICATE OF CORRECTION

| | | |
|---|---|---|
| PATENT NO. | : 7,859,223 B2 | Page 1 of 1 |
| APPLICATION NO. | : 12/011615 | |
| DATED | : December 28, 2010 | |
| INVENTOR(S) | : Jeremy Richard Gorbold | |

It is certified that error appears in the above-identified patent and that said Letters Patent is hereby corrected as shown below:

Title page, item 54, line 1, change "MONTORING" to -- MONITORING -- therefor.

At column 1, line 1, change "MONTORING" to -- MONITORING -- therefor.

At column 6, line 39, in Claim 1, change "cascade" to -- cascode -- therefor.

At column 8, line 19, in Claim 20, change "cascade" to -- cascode -- therefor.

Signed and Sealed this
Fourteenth Day of June, 2011

David J. Kappos
*Director of the United States Patent and Trademark Office*